United States Patent
Sharma

(10) Patent No.: US 7,018,939 B2
(45) Date of Patent: Mar. 28, 2006

(54) MICELLAR TECHNOLOGY FOR POST-ETCH RESIDUES

(75) Inventor: Balgovind K. Sharma, Saint Ismier (FR)

(73) Assignee: Motorola, Inc., Schaumburg, IL (US)

(*) Notice: Subject to any disclaimer, the term of this patent is extended or adjusted under 35 U.S.C. 154(b) by 85 days.

(21) Appl. No.: 10/618,228

(22) Filed: Jul. 11, 2003

(65) Prior Publication Data

US 2005/0009359 A1   Jan. 13, 2005

(51) Int. Cl.
*H01L 21/302* (2006.01)

(52) U.S. Cl. .................... 438/747; 438/750; 438/754

(58) Field of Classification Search ............ 438/745, 438/747, 750, 753, 754
See application file for complete search history.

(56) References Cited

U.S. PATENT DOCUMENTS

| | | | |
|---|---|---|---|
| 5,038,249 A | 8/1991 | Rounds | 361/311 |
| 5,133,955 A | 7/1992 | Raghavan et al. | 423/592 |
| 5,245,512 A | 9/1993 | Rounds | 361/504 |
| 5,770,172 A | 6/1998 | Linchan et al. | 423/561.1 |
| 6,001,795 A | 12/1999 | Charlez et al. | 510/365 |
| 6,036,886 A | 3/2000 | Chhabra et al. | 252/301.4 |
| 6,103,627 A * | 8/2000 | Robinson et al. | 438/692 |
| 6,177,356 B1 | 1/2001 | Zinman et al. | 438/729 |
| 6,255,269 B1 | 7/2001 | Leonard et al. | 510/238 |
| 6,268,330 B1 | 7/2001 | Leonard et al. | 510/417 |
| 6,346,508 B1 | 2/2002 | Leonard et al. | 510/417 |
| 6,423,148 B1 * | 7/2002 | Aoki | 134/3 |
| 6,440,856 B1 * | 8/2002 | Bessho et al. | 438/691 |
| 6,641,678 B1 * | 11/2003 | DeYoung et al. | 134/36 |
| 6,825,156 B1 * | 11/2004 | Lee et al. | 510/176 |
| 2002/0013239 A1 * | 1/2002 | Sahbari | 510/175 |
| 2004/0058626 A1 * | 3/2004 | Filipozzi et al. | 451/57 |

OTHER PUBLICATIONS

Micelle; http://www.answers.com/topic/micelle, pp. 1-2.*
Low-k dielectric; http://www.semiconductorglossary.com/default.asp?SearchedField=Yes?SearchTerm=low-k; p. 1.*
International Sematech, "Low-K Dielectrics"; 2001 Annual Report; 2 pages.

* cited by examiner

*Primary Examiner*—Nadine G. Norton
*Assistant Examiner*—Binh X. Tran
(74) *Attorney, Agent, or Firm*—John A. Fortkort; Fortkort & Houston P.C.

(57) ABSTRACT

A method is provided herein for cleaning a semiconductor device. In accordance with the method, a semiconductor device is provided (11), and a micellar solution is applied (13) to the semiconductor device. The method is particularly useful for cleaning copper and silicon surfaces and removing processing residues from the surfaces of vias or trenches.

24 Claims, 6 Drawing Sheets

MICELLAR TECHNOLOGY FOR POST-ETCH RESIDUES

FIELD OF THE INVENTION

The present invention relates generally to semiconductor processing, and more particularly to the use of micellar technology in removing post-etch residues from vias.

BACKGROUND OF THE INVENTION

The via etch procedures commonly used in semiconductor processing, and especially in back-end-of-line (BEOL) processing of semiconductor devices, typically results in the formation of processing residues. These residues are often organometallic and polymeric in nature, and have elemental compositions that may include C, O, F, Si, Cu, H, and N. These residues tend to accumulate on the bottom and sidewalls of vias, where their presence gives rise to a number of problems such as low device yield, high via resistance, via voids, and reliability concerns.

Many attempts have been made in the art to remove these processing residues from vias through the use of various cleaning formulations, so that the aforementioned problems will not be encountered. However, such cleaning formulations frequently cause complications of their own. For example, strong organic solvents such as hydroxylamine (HDA) have often been used to remove these residues, but the use of such solvents is expensive, hazardous, environmentally unfriendly, and often requires processing times that are longer than desired. Moreover, most solvent systems based on a single solvent or a small number of solvents are ineffective at removing all components of such residues from vias, given the complex chemistry of these residues.

Complex, multi-component solvent systems have also been developed for use as cleaning formulations that are targeted at the particular processing residues formed in specific fabrication lines. However, these complex systems are very expensive to develop and produce, and must be re-engineered to account for any changes in the fabrication process. Moreover, cleaning formulations of this type are also frequently detrimental to the metal and dielectric components of the device being treated. Consequently, their use may result in the same types of yield loss and poor electrical performance attributable to the presence of the residues themselves.

The use of cleaning formulations based on semi-aqueous chemistries, such as those based on $NH_4F$ or dilute solutions of HF (often referred to as DHF), is also known. However, these chemistries are not effective at removing all processing residues or components thereof from vias. Moreover, chemistries of this type tend to corrode underlying metal layers and to undercut barrier layers, thus resulting in undesirable dielectric lift-off.

The above-noted infirmities in existing cleaning formulations have been exacerbated by the continuing movement toward reduced chip sizes. In particular, as chip sizes become increasingly small, the presence of processing residues in the vias of these chips results in larger yield losses and greater reductions in device performance. Moreover, reduced chip sizes have necessitated the use of low K structures (that is, structures with bulk dielectric constants (K) below 3.0) as a result of the need to more tightly control conductor pathways. However, conventional cleaning formulations of the type noted above are not suitable for use on low-K structures because they tend to increase the K values of these structures, thereby compromising device performance.

There is thus a need in the art for cleaning formulations that are effective at removing processing residues from vias, such as those commonly formed during the etch procedures used in BEOL processing. There is further a need in the art for cleaning formulations that can be used with low-K structures without detrimentally affecting the K values or constituent layers of these structures. These and other needs are met by the compositions and methodologies as hereinafter described.

DETAILED DESCRIPTION

It has now been found that cleaning formulations based on micellar solutions can be used to effectively remove processing residues from the bottoms and sidewalls of vias, trenches or other openings or features in or on semiconductor substrates or structures, including processing residues of the type that are commonly formed during BEOL processing and in other via or trench etch procedures. While these cleaning formulations can be used to clean processing residues from a variety of devices, they are particularly useful with low-K structures, due to their ability to clean these structures without detrimentally affecting the K values or constituent layers thereof. The use of these cleaning formulations is found to improve the yield and electrical performance of these devices. Moreover, these cleaning formulations are inexpensive, environmentally benign, and non-hazardous.

Without wishing to be bound by theory, it is believed that the presence of hydrophilic and lipophilic moieties present in the surfactants that make up micellar solutions, and the unique structures that these surfactants can assume in such solutions, are at least partially responsible for allowing micellar solutions to effectively solvate the processing residues frequently formed as a byproduct of via etching and to remove these residues from the surfaces of vias and other semiconductor structures. Thus, for example, in micellar solutions, surfactant molecules can arrange themselves into free-floating micelles in which the hydrophobic portions of these molecules are facing inward and in which the hydrophilic portions of these molecules are facing outward. This arrangement allows for efficient solvation of both hydrophobic and hydrophilic materials. On the other hand, since micellar solutions are typically relatively mild in terms of their chemical reactivity, their use does not adversely affect device attributes (e.g., K-values) or performance characteristics.

Micelles are electrically charged colloidal particles, usually organic in nature, that are composed of aggregates of large surfactant molecules. They are readily formed in surfactant solutions of appropriate pH, temperature, water content, and electrolyte composition when the concentration of surfactant in the solution exceeds a certain level called the Critical Micelle Concentration (CMC).

Figure 1:
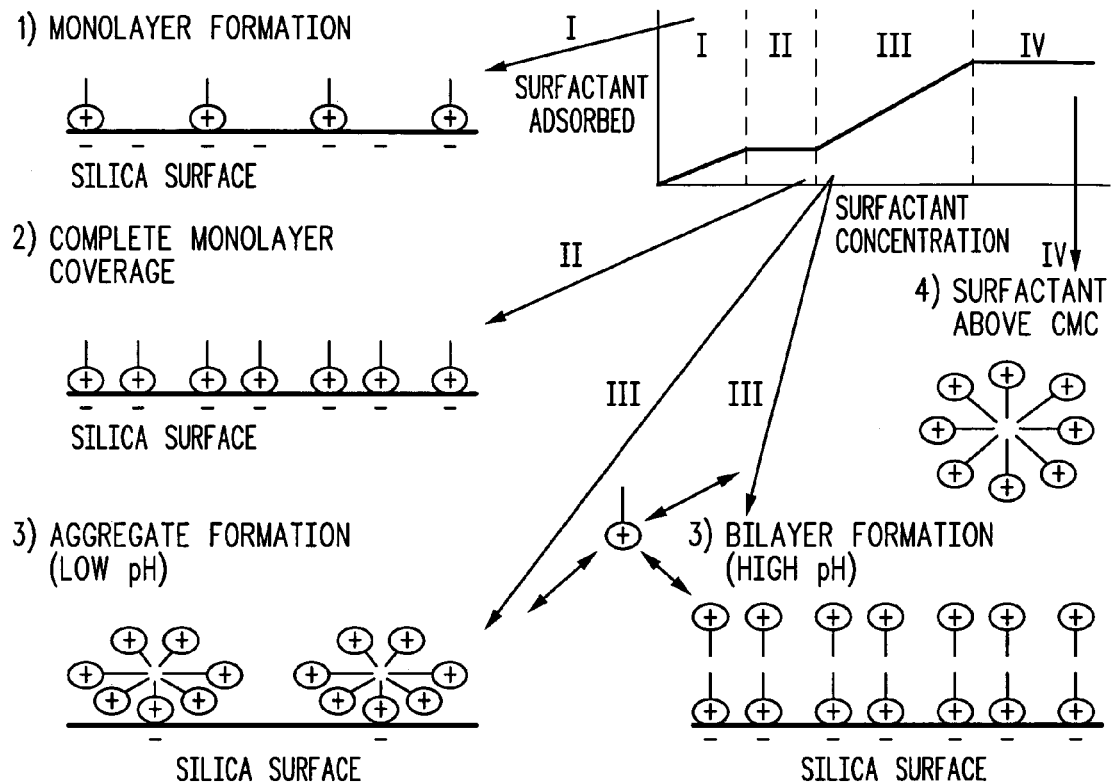
FIG. 1 is a phase diagram illustrating the various structures surfactants can assume in solution as surfactant concentration changes.

The significance of the CMC can be appreciated from FIG. 1, which is a phase diagram depicting the behavior of a typical cationic surfactant as a function of concentration in the presence of a silica surface. Similar phase diagrams may be constructed for anionic and non-ionic surfactants. At low concentrations, depicted by REGION I of FIG. 1, the surfactant is adsorbed sparsely onto the silica surface, with the cationic portion of the surfactant adhering to the negatively charged silica surface and the non-ionic tail of the surfactant extending into solution.

As the concentration of surfactant increases, as depicted by REGION II of the phase diagram of FIG. 1, the surfactant is adsorbed more evenly across the silica substrate to form a monolayer. As is the case in REGION I, however, the cationic portion of the surfactant adheres to the negatively charged silica surface, and the non-ionic tail of the surfactant extends into solution.

As depicted by REGION III of the phase diagram of FIG. 1, as the concentration of surfactant increases still further, the surfactant begins to adopt more complicated structures. Depending on the pH of the solution, the surfactant may adopt aggregate formations (for low pH solutions) or bilayer formations (for high pH solutions). In both types of formations, the structure remains anchored to the silica substrate by way of the cationic heads of the surfactant.

Figure 2:
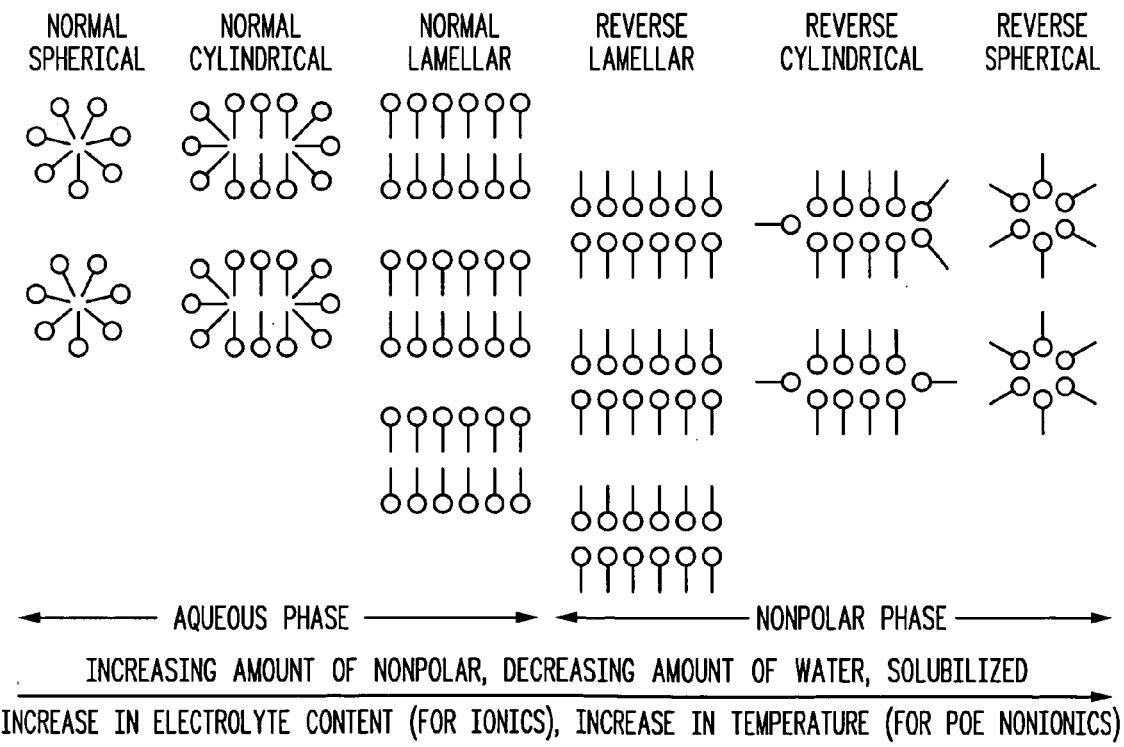
FIG. 2 is an illustration of some of the micellar structures that surfactants can assume in solution.

Finally, as depicted in REGION IV of the phase diagram of FIG. 1, when the surfactant concentration exceeds the CMC, the surfactant forms micellar solutions, in which the surfactant molecules assemble into free-floating aggregates. These free-floating aggregates may be made to assume a number of formations, including normal spherical, normal cylindrical, normal lamellar, reverse lamellar, reverse cylindrical, and reverse spherical formations. These formations are depicted in FIG. 2. The particular formation assumed by the aggregate depends on such factors as the phase the surfactant is in (e.g., whether the surfactant is in the aqueous or non-polar phase), the amount of each phase present in the solution, the temperature of the solution, the chemistry of the surfactant, and the amount of electrolyte in the solution.

A variety of micelles and micellar solutions may be used in the practice of the methods disclosed herein. The optimal choice for a particular application may depend on such factors as the specific chemistry of the residues to be removed, the nature of the substrate, and other such factors. Specific examples of micelles and micellar solutions that may be useful in removing residues from vias and other semiconductor structures in accordance with the methodologies disclosed herein include, but are not limited to, micellar solutions based on n-alkyl carboxylates such as sodium laurate (n-dodecanoate), wherein n is typically within the range of about 8 to about 22; n-alkyl sulfates and sulfonates such as sodium n-dodecyl sulphate (NaLS), wherein n is again typically within the range of about 8 to about 22; quaternary ammonium halides such as hexadecyl (cetyl) trimethylammonium halide; salts of the di-esters of sulfosuccinic acid; alkyl phenol derivatives; fluorosurfactants, such as, for example, Zonyl® FS-62 anionic fluorosurfactant and Zonyl® FSO-100 nonionic surfactant (both available commercially from Dupont, Inc., Wilmington, Del.); and surfactants such as tris (2-hydroxyethyl) tallow-alkyl ammonium acetate (TTAA). The surfactants used in the micellar solutions described herein may be cationic, anionic, or nonionic, and may employ various counterions where applicable, including, but not limited to, aromatic counterions such as sodium salicylate (NaSal).

The concentration of surfactant in the micellar solutions used in the methodologies disclosed herein may vary. Typically, the surfactant will be present in the solution at a concentration of less than about 5% by weight. Preferably, the surfactant will be present in the solution at a concentration within the range of about 0.01% to about 1% by weight, more preferably at a concentration within the range of about 0.05% to about 0.5% by weight, and even more preferably at a concentration within the range of about 0.075% to about 0.25% by weight. Most preferably, the surfactant is present in the solution at a concentration of about 0.1% by weight.

The micellar solutions used in the methodologies disclosed herein are preferably aqueous solutions, and may contain various ingredients in addition to the surfactant. Such additional ingredients may include inorganic and organic acids, such as citric acid, oxalic acid, or mixtures thereof. Typically, the total amount of such acids present in the solution is within the range of about 0.5% to about 30% by weight, preferably within the range of about 1% to about 20% by weight, more preferably within the range of about 5% to about 15% by weight, and most preferably about 10% by weight.

Other possible ingredients in the solution include cosolvents, which may be, for example, ethers, alcohols, amines, amides, polyethers, polyols, polyamines, or polyamides. The use of alkyl-substituted ethers such as EGMBE is especially preferred. The amount of cosolvent may vary and may depend, at least in part, on the chemistry of the micellar solution. Typically, however, the amount of cosolvent present in the micellar solution is within the range of about 0.1% to about 30% by weight, preferably within the range of about 1% to about 20% by weight, and more preferably within the range of about 5% to about 15% by weight. Most preferably, the amount of cosolvent present in the micellar solution is about 10% by weight.

The solutions and methodologies disclosed herein will now be further illustrated by the following non-limiting examples. In these examples, unless otherwise specified, all percentages of the solution components are % by weight, based on the total weight of the solution. The following materials are referenced in the examples:

Ashland Surfactant®: a hydrocarbon surfactant available commercially from Ashland, Inc. (Columbus, Ohio).

Deer Clean®: a 3% oxalic acid solution available commercially from Kanto Corporation (Portland, Oreg.).

Zonyl® FS-62: an anionic fluorosurfactant available commercially from DuPont, Inc. (Wilmington, Del.) and having the chemical formula

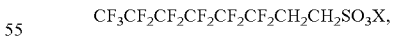

wherein X=H or $NH_4$.

Zonyl® 9361: An anionic fluorinated surfactant available commercially from Dupont, Inc. and having the chemical formula

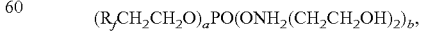

wherein a+b=3 and $R_f$=$F(CF_2CF_2)_n$ where n =3.

Zonyl® FSO-100: a nonionic fluorosurfactant, available commercially from Dupont, Inc. and having the chemical formula $R_fCH_2CH_2O(CH_2CH_2O)_xH$.

The above noted materials are used at low concentrations close to the CMC. Micellar solutions of these materials may be prepared from the available off-the-shelf products through suitable modification of the surfactant concentration.

FSA+DHF: A mixture of 1:600 HF with Dupont Zonyl® FSA surfactant.

Oxalic acid: An aqueous solution of 3% oxalic acid.

EGMBE: Ethylene glycol monobutyl ether, used as a 5% aqueous solution.

FSB: Zonyl® FSB, a fluorosurfactant available commercially from Dupont, Inc.

Citric acid: An aqueous solution of 3% citric acid.

COMPARATIVE EXAMPLE 1

This example illustrates how the presence of post-etch residues in vias adversely affects product yield in a baseline process (i.e., a process in which the vias are not cleaned after etching).

A batch of short loop wafer samples was provided. The 8" patterned wafer samples consisted of 130/90 nm technology node BEOL single or dual inlaid via and trench structures used in six-level metal builds with copper/FTEOS or copper/SiCOH technology. The underlying Cu metal was exposed at the via bottom after dry etching of the dielectric stack. The sidewall stack consisted of either SiN/FTEOS or SiCN/SiCOH. The vias in the wafers were about 600 nm in length and varied from about 100 nm to about 175 nm in width. The tested structures varied from small 1K via arrays to large 11 million via zigzag arrays.

Figure 3:
FIG. 3 is a micrograph showing the presence of post-etch residues in a via.

After the dry etching was completed, and before the samples were cleaned, a series of post-etch cross-sectional SEM images of some of the vias was obtained from the samples. The SEM image of FIG. 3 is representative. As seen therein, when the samples are not properly cleaned, post-etch residues are visible on the via sidewalls and on the Cu metal at the bottom of the vias.

The Kelvin contact resistance between conductor levels in the wafers was then determined through class probe analysis. The probes utilized were standard semiconductor class probes that provide yield data. The results are plotted in FIG. 5. By convention, the Kelvin contact resistance quoted for a particular chemistry is the Kelvin contact resistance at a cumulative percentage of 50% (that is, 50% of the wafers tested have a contact resistance equal to or less than the quoted Kelvin contact resistance for that chemistry). Thus, the Kelvin contact resistance of the baseline process (that is, the Kelvin contact resistance of the post-etch wafers not subjected to cleaning) is 1.7 ohms/contact.

Figure 6:
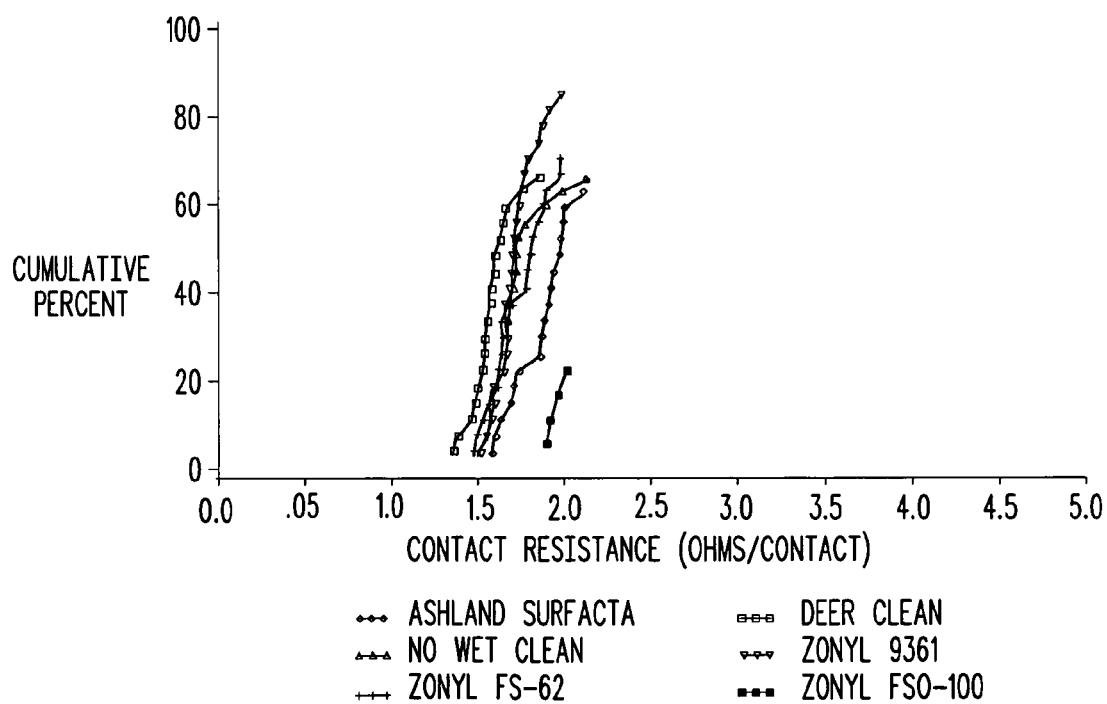

The via chain yield was also determined for the wafers. The results are depicted in FIG. 6 and are set forth in TABLE 1. In FIG. 6, the via chain yield is the final saturated value where the curve ends at the top. As seen therein, without cleaning, the process gave a via chain yield of about 63%.

EXAMPLES 1–5

These examples illustrate the improvements possible in contact resistance and yield through the use of micellar cleaning solutions.

The process of COMPARATIVE EXAMPLE 1 was repeated. This time, however, a subsequent cleaning step using various micellar solutions was employed to remove post-etch residues in the open via landings on the exposed Cu surface. Each experiment included several wafers (at least 4 per chemistry ) that were processed through the micellar solution post-etch to evaluate the cleaning efficiency of the micellar solution.

EXAMPLES 1–5 utilized five different aqueous, micellar solutions based on the surfactants listed in TABLE 1. In each solution, the concentration of the surfactant was adjusted to 0.1%. EGMBE was used as a 5% solution, whereas citric acid and oxalic acid were used as 3% solutions. These micellar solutions were then used to clean die of the type used in COMPARATIVE EXAMPLE 1 in a post-etch process. After the die were cleaned and dried, the Kelvin contact resistance of the wafers was determined following the same procedures as used in COMPARATIVE EXAMPLE 1. The results are depicted graphically in FIG. 5 and are also set forth in TABLE 1.

Figure 5:
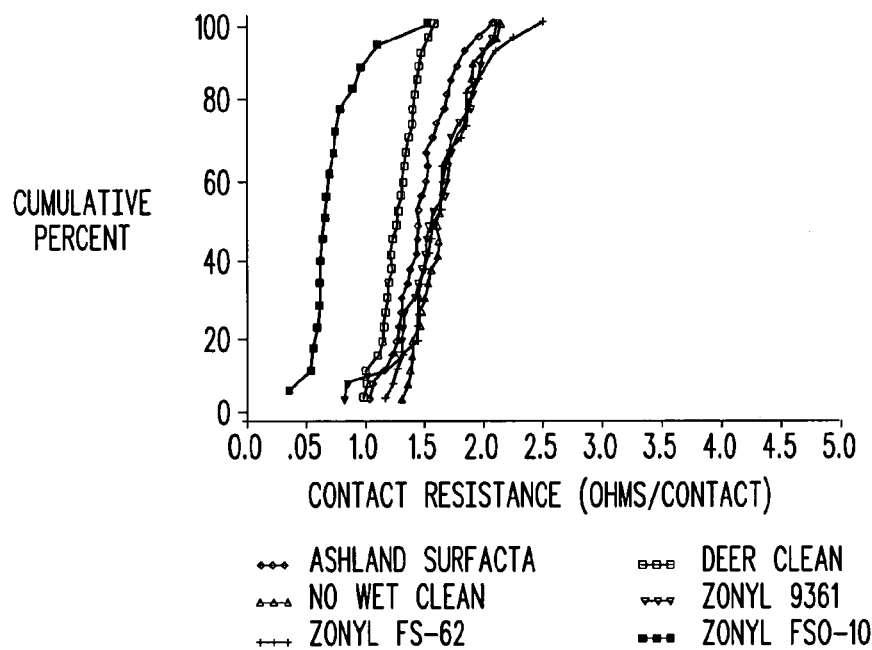
FIGS. 5–10 are graphs of cumulative percent as a function of contact resistance.

As indicated by the results shown in FIG. 5 and TABLE 1, the use of a micellar solution in cleaning the vias had a dramatic affect on Kelvin contact resistance in some instances. Thus, while the baseline process of COMPARATIVE EXAMPLE 1 gave rise to a Kelvin contact resistance of about 1.7 ohms/contact, the Kelvin contact resistance of wafers cleaned with the micellar solutions were, in some cases, significantly lower. For instance, in EXAMPLE 5, the Kelvin contact resistance measured was only about 0.8 ohms/contact, which is about half of the Kelvin contact resistance for the baseline process (i.e., the process of COMPARATIVE EXAMPLE 1), while in EXAMPLES 2 and 3, the Kelvin contact resistances measured were about 1.3 ohms/contact and about 1.5 ohms/contact, respectively. In EXAMPLES 3 and 4, the measured Kelvin contact resistances were both about 1.6, slightly less than that yielded by the baseline process.

The via chain yield was also determined for the materials of EXAMPLES 1–5. The results are depicted in FIG. 6 and are set forth in TABLE 1. As noted above, the via chain yields in FIG. 6 are the final saturated values where each curve ends at the top. Compared to the baseline process of COMPARATIVE EXAMPLE 1 which gave a via chain yield of about 63%, the use of cleaning formulations based on micellar solutions gave via chain yields that were, in most cases, either superior to or comparable to the baseline process. Thus, the solution of EXAMPLE 1 afforded the highest yield (about 90%), while the solution of EXAMPLE 2 also exhibited an improvement in yield over the baseline process (70%). The solutions of EXAMPLES 3 and 4 gave rise to via chain yields that were comparable to the baseline process, while the solution of EXAMPLE 5 had a via chain yield of about 25%. These results demonstrate that micellar solutions can improve yield and lower contact resistances, thus suggesting that these solutions are effective at removing post-etch residues.

Figure 4:
FIG. 4 is a micrograph of a post-etch via treated with a micellar solution.

The efficacy of the micellar solutions of EXAMPLES 1–5 in removing post-etch residues has also been confirmed by post-etch cross-sectional SEM images of the vias obtained from these samples, of which the SEM image of FIG. 4 is representative. As seen therein, when the samples are cleaned using the micellar solutions described herein, post-etch residues are effectively removed from the via sidewalls and from the Cu metal at the bottom of the vias.

TABLE 1

Contact Resistances and Via Chain Yields

| Example No. | Surfactant Identity | Contact Resistance (ohms/contact) | Via Chain Yield (%) |
| --- | --- | --- | --- |
| C-1 | None | 1.7 | 63 |
| E-1 | Ashland Surfactant ® | 1.5 | 90 |

TABLE 1-continued

Contact Resistances and Via Chain Yields

| Example No. | Surfactant Identity | Contact Resistance (ohms/contact) | Via Chain Yield (%) |
|---|---|---|---|
| E-2 | Deer Clean ® | 1.3 | 65 |
| E-3 | Zonyl ® FS-62 | 1.6 | 70 |
| E-4 | Zonyl ® 9361 | 1.6 | 64 |
| E-5 | Zonyl ® FSO-100 | 0.8 | 25 |

COMPARATIVE EXAMPLE 2

This example illustrates how the presence of post-etch residues in vias adversely affects product yield in a baseline process (i.e., a process in which the vias are not cleaned) for die containing large via structures.

Following the general procedures of COMPARATIVE EXAMPLE 1, the via chain yield in small and large zigzag array structures (such as BE863.1 and 4K via arrays) were determined. These arrays are a particularly good measure of the efficacy of a cleaning solution in removing post-etch residues in that they contain large via structures that can show significant yield difference with proper cleaning. By contrast, smaller via structure (e.g., 1000 to 10K) zigzag via arrays do not always show significant yield differences with cleaning.

Figure 7:
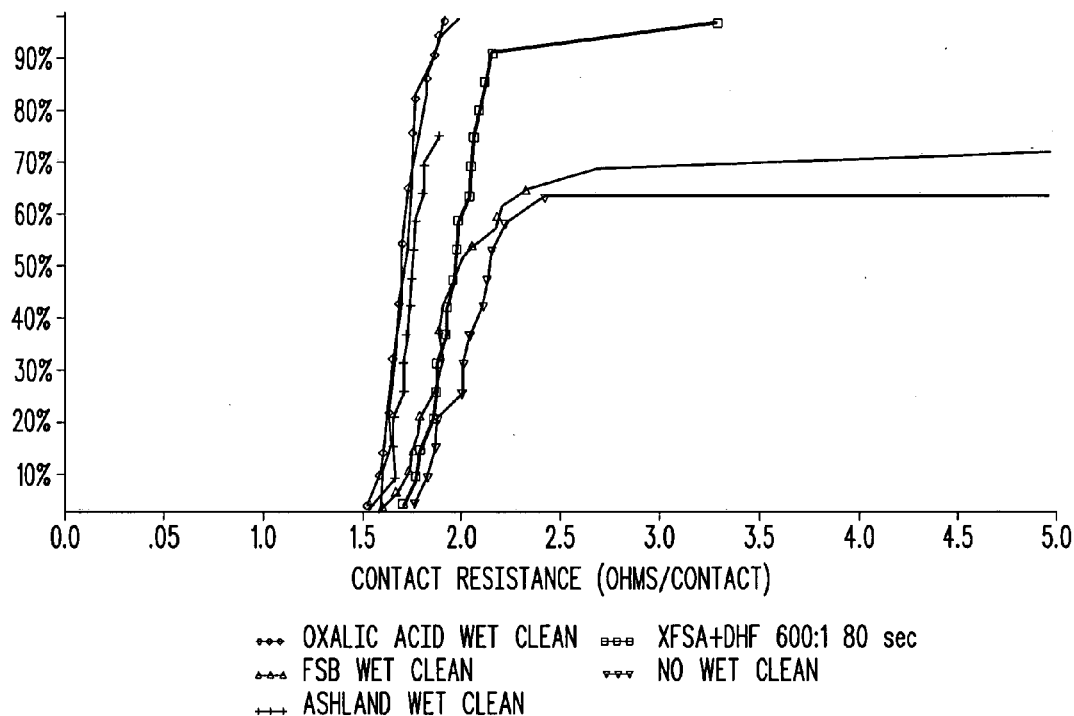

The results for the baseline process are set forth in TABLE 2 and illustrated graphically in FIG. 7. As seen therein, the via chain yield was about 63% for the baseline process.

EXAMPLES 6–10

These examples illustrate the improvements possible in contact resistance and yield through the use of micellar cleaning solutions on die containing large via structures.

In EXAMPLES 6–10, six aqueous, micellar solutions were prepared based on the surfactants listed in TABLE 2. In each solution, the concentration of the surfactant was adjusted to 0.1%. EGMBE was used as a 5% solution, whereas citric acid and oxalic acid were used as 3% solutions. These micellar solutions were then used to clean die of the type used in COMPARATIVE EXAMPLE 2. After the die were cleaned and dried, the contact resistance of the wafers was determined. The results are depicted graphically in FIG. 7 and are summarized in TABLE 2. The number of die used in each experiment is also indicated in TABLE 2.

TABLE 2

Via Chain Yields on BE836.1 Zig-Zag Die

| Example No. | Surfactant Identity | Via Chain Yield (%) |
|---|---|---|
| C-2 | None | 63 |
| E-6 | FSA + DHF | 100 |
| E-7 | FSB | 63 |
| E-8 | EGMBE | 100 |
| E-9 | Ashland Surfactant ® | 100 |
| E-10 | Oxalic acid | 100 |

As shown by the data in TABLE 2 and FIG. 7, the use of micellar solutions significantly improved via chain yields over the baseline process. Thus, while the baseline process for these die gave via chain yields of only 63%, the use of all of the micellar solutions (except for the solution of EXAMPLE 7) gave via chain yields of 100%.

COMPARATIVE EXAMPLES 3–5

This example illustrates how the presence of post-etch residues in vias adversely affects product yield in a baseline process (i.e., a process in which the vias are not cleaned) for wafers having a relatively large number of vias.

Figure 8:
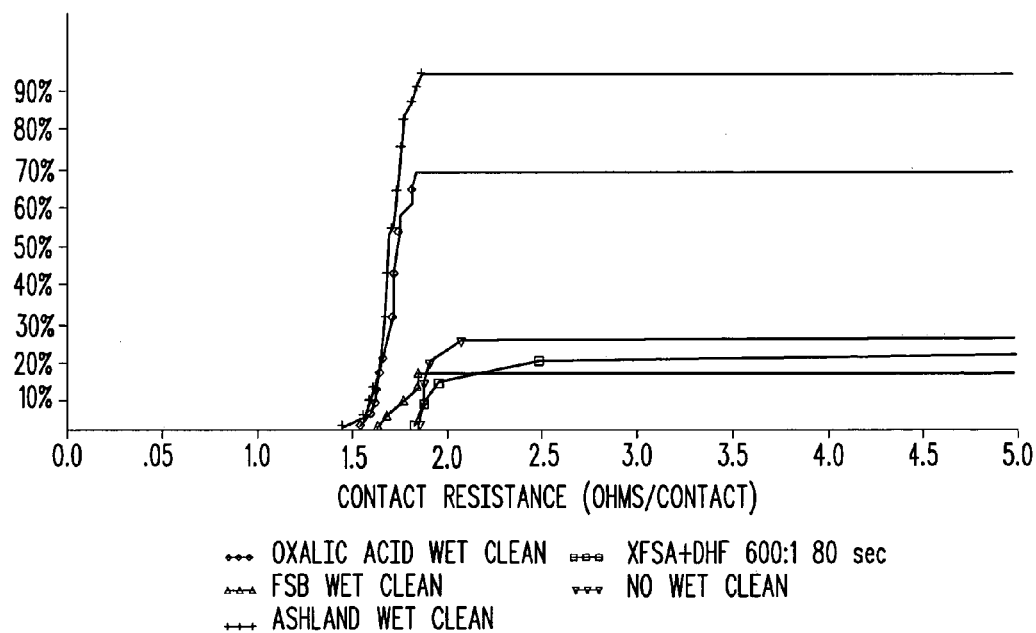
Figure 9:
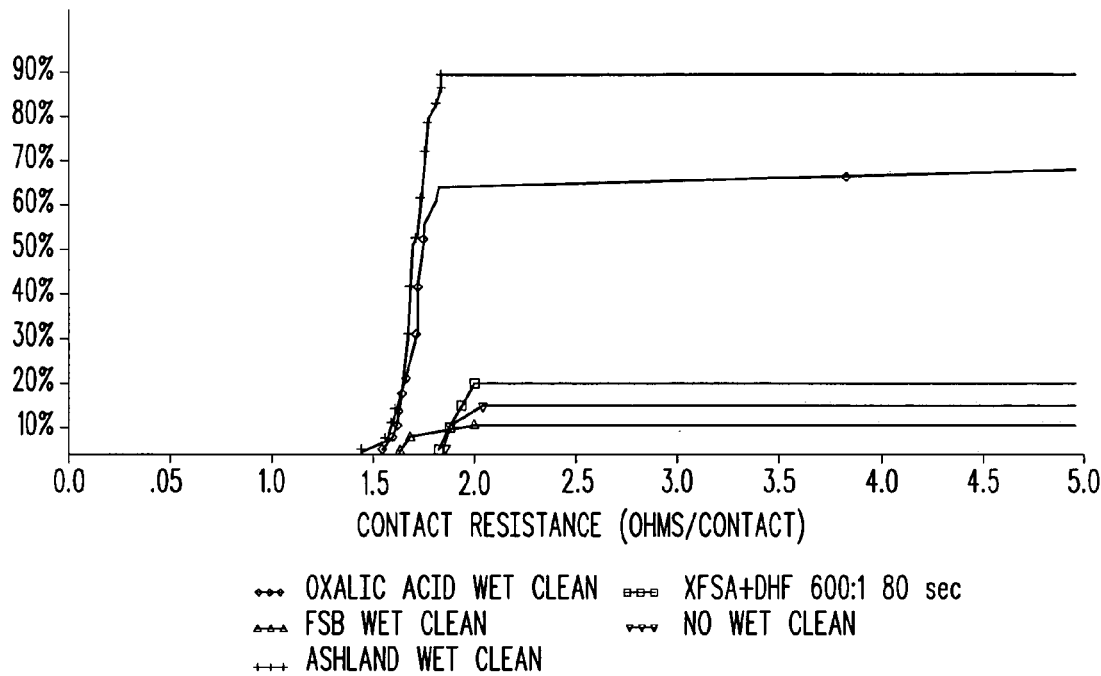
Figure 10:
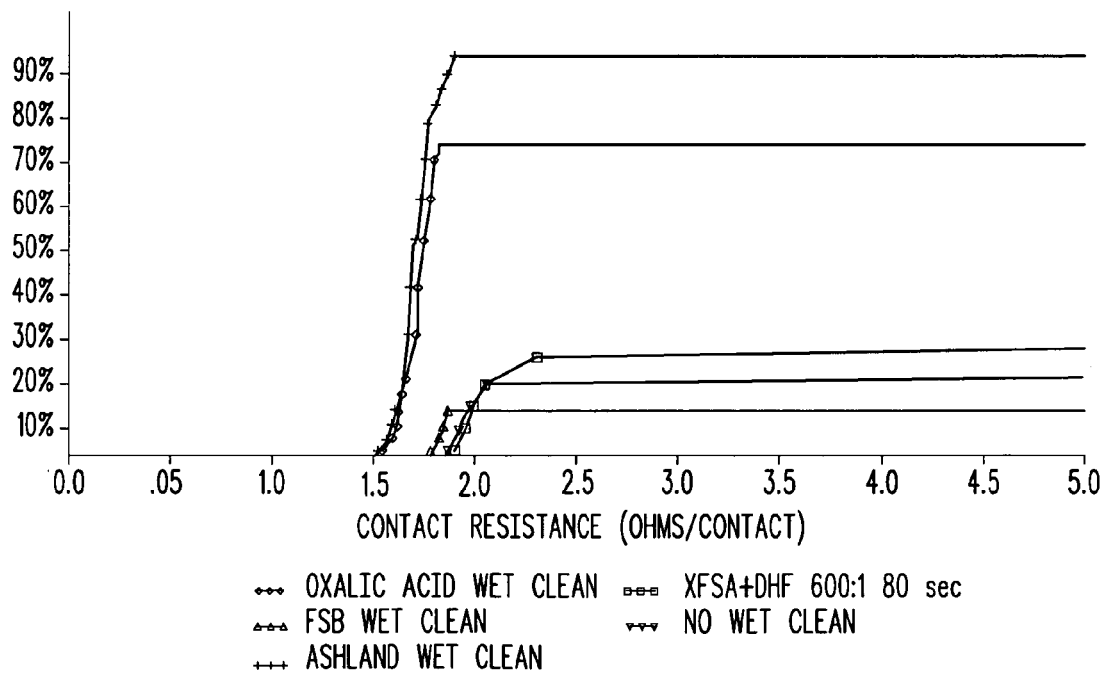

The via chain yield experiment of COMPARATIVE EXAMPLE 1 was repeated, except that the die utilized was a BE863 die with BE863.1 and BE863.2 structures. This die has approximately 11 million via structures with 3× spacing, and is thus a good benchmark to compare yields for different treatments. After the die were cleaned and dried, via chain yield measurements were conducted at two different locations on each structure (denoted C1 and C2), for a total of four different locations on the die. The results are depicted graphically in FIGS. 8–10 and are summarized in TABLE 3.

As the results indicate, the baseline process is characterized by very low via chain yields, ranging from 15–25%. Such yields are much too low for a commercially feasible fabrication line.

EXAMPLES 11–21

These examples illustrate the improvements possible in contact resistance and via chain yield through the use of micellar cleaning solutions on wafers have a large number of vias.

COMPARATIVE EXAMPLES 3–5 were repeated, except this time the vias in the die were cleaned with the micellar solutions indicated in TABLE 3. The results are depicted graphically in FIGS. 8–10 and are summarized in TABLE 3.

As the results indicate, the use of certain micellar solutions affords dramatic increases in via chain yields. The micellar solutions of EXAMPLES 11–13 were especially effective and were seen to give via chain yields of about 90–96%, far above the yields afforded by the baseline process. The micellar solutions of EXAMPLES 14–15 also provided dramatically improved via chain yields (70–78%).

TABLE 3

Via Chain Yields on BE836 Die

| Example No. | Surfactant No. | Surfactant Identity | Via Zigzag Array Location | Via Chain Yield (%) |
|---|---|---|---|---|
| C-2 | None | None | 863.1 C1 | 15 |
| C-3 | None | None | 863.1 C2 | 25 |
| C-4 | None | None | 863.2 C2 | 22 |
| E-11 | S1 | Ashland Surfactant ® | 863.1 C1 | 90 |
| E-12 | S1 | Ashland Surfactant ® | 863.1 C2 | 96 |
| E-13 | S1 | Ashland Surfactant ® | 863.2 C2 | 96 |
| E-14 | S2 | EGMBE | 863.1 C2 | 70 |
| E-15 | S2 | EGMBE | 863.2 C2 | 78 |
| E-16 | S3 | FSA + DHF 600:1 80 sec | 863.1 C1 | 20 |
| E-17 | S3 | FSA + DHF 600:1 80 sec | 863.1 C2 | 22 |
| E-18 | S3 | FSA + DHF 600:1 80 sec | 863.2 C2 | 28 |
| E-19 | S4 | FSB | 863.1 C1 | 10 |
| E-20 | S4 | FSB | 863.1 C2 | 18 |
| E-21 | S4 | FSB | 863.2 C2 | 15 |

Figure 11:
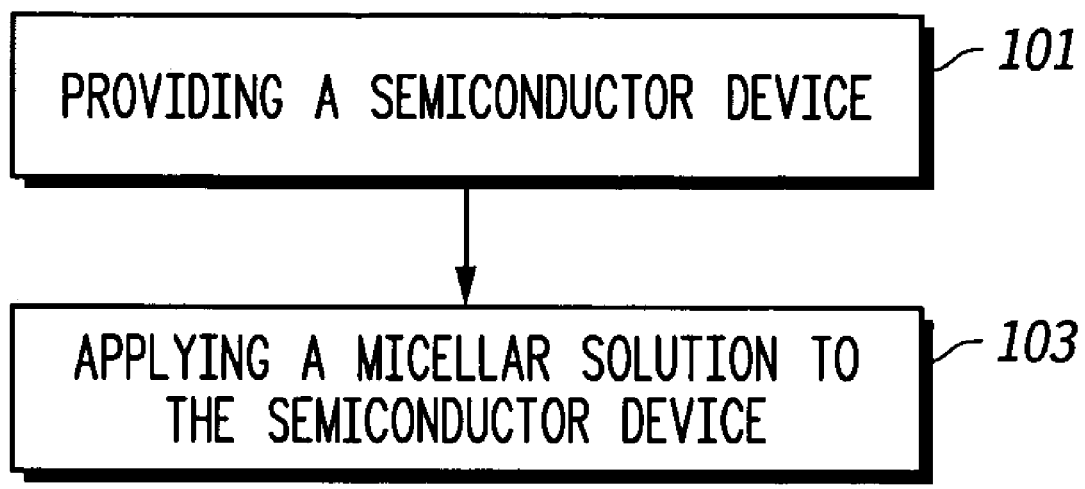
FIG. 11 is an illustration of one embodiment of the methodology disclosed herein.

FIG. 11 illustrates the steps of one embodiment of the methodology disclosed herein. In accordance with the method, a semiconductor device is provided 11. The device may be, for example, a low K semiconductor device with copper conductor layers, and typically comprises a semiconductor substrate with a plurality of vias defined therein. The vias typically have a processing residue disposed on the surfaces thereof that was formed as a byproduct of via etching, and that typically comprises organometallic polymers.

Next, a micellar solution is applied 13 to the semiconductor device. The micellar solution is preferably an aqueous solution of a hydrocarbon surfactant, and is adapted to at least partially remove the processing residue from the surfaces of the vias.

Cleaning formulations have been provided herein that comprise micellar solutions. These solutions are effective at removing post-etch residues from vias of the type that are commonly formed during BEOL processing, and can be used with low-K structures without detrimentally affecting the K values or constituent layers of these structures.

The above description of the invention is illustrative, and is not intended to be limiting. It will thus be appreciated that various additions, substitutions and modifications may be made to the above described embodiments without departing from the scope of the present invention. Accordingly, the scope of the present invention should be construed solely in reference to the appended claims.

What is claimed is:

1. A method for cleaning a semiconductor device, comprising the steps of:
   providing a semiconductor device having organometallic processing residues on a surface thereof; and
   removing the residues through the application of a micellar solution;
wherein the micellar solution comprises, by weight, about 0.01% to about 1% surfactant, about 1% to about 10% citric acid, and about 1% to about 10% oxalic acid.

2. The method of claim 1, wherein the semiconductor device has a bulk dielectric constant K which is below 3.0.

3. The method of claim 1, wherein the surfactant is a hydrocarbon surfactant.

4. The method of claim 1, wherein the surfactant is a fluorocarbon surfactant.

5. The method of claim 1, wherein the surfactant has at least one carboxyl group.

6. The method of claim 1, wherein the micellar solution comprises an aqueous solution of fluorosurfactant and hydrofluoric acid.

7. The method of claim 1, wherein the micellar solution comprises ethylene glycol monobutyl ether.

8. The method of claim 1, wherein the semiconductor device contains copper conductor levels.

9. The method of claim 1, wherein the semiconductor device has a surface comprising a material selected from the group consisting of copper and silicon, and wherein the micellar solution is used to clean the surface.

10. The method of claim 1, wherein said solution is devoid of hydroxylamine solvents.

11. The method of claim 1, wherein the semiconductor device contains at least one opening, and wherein the micellar solution is applied to the opening.

12. The method of claim 11, wherein the opening has processing residues on a surface thereof which were formed during the creation of the opening, and wherein the micellar solution is adapted to remove the processing residues.

13. The method of claim 12, wherein the processing residues include organometallic polymers.

14. A method for removing processing residues from a semiconductor substrate, comprising the step of:
   providing a semiconductor substrate having a plurality of openings therein, said openings having a processing residue disposed on a surface thereof; and
   applying a micellar solution to the substrate, thereby removing at least a portion of the processing reside from the plurality of openings;
wherein the micellar solution comprises, by weight, about 0.01% to about 1% hydrocarbon surfactant, about 1% to about 10% citric acid, and about 1% to about 10% oxalic acid.

15. The method of claim 14, wherein the processing residue is formed, at least in part, when the openings are etched.

16. The method of claim 14, wherein the semiconductor substrate contains copper conductor levels.

17. A method for making a semiconductor device, comprising the steps of:
   providing a semiconductor substrate;
   etching a plurality of openings in the semiconductor substrate such that, upon completion of the etch, at least some of the openings have a processing residue disposed on a surface thereof, the processing residue having been formed during the etching process; and
   removing at least a portion of the processing residue by contacting the processing residue with a micellar solution;
wherein the micellar solution comprises, by weight, about 0.01% to about 1% hydrocarbon surfactant, about 1% to about 10% citric acid, and about 1% to about 10% oxalic acid.

18. The method of claim 17, wherein the micellar solution further comprises, by weight, about 1% to about 10% ethylene glynol monobutyl ether (EGMBE).

19. The method of claim 17, wherein the semiconductor substrate has a bulk dielectric constant K which is below 3.0.

20. The method of claim 17, wherein the processing residues include organometallic polymers.

21. The method of claim 17, wherein the micellar solution further comprises a fluorocarbon surfactant.

22. The method of claim 17, wherein the micellar solution further comprises an aqueous solution of fluorosurfactant and hydrofluoric acid.

23. The method of claim 17, wherein the semiconductor device contains copper conductor levels.

24. The method of claim 17, wherein the semiconductor device has a surface comprising copper, and wherein the micellar solution is used to clean the surface.

* * * * *

UNITED STATES PATENT AND TRADEMARK OFFICE
CERTIFICATE OF CORRECTION

PATENT NO. : 7,018,939 B2
DATED : March 28, 2006
INVENTOR(S) : S. Harma

It is certified that error appears in the above-identified patent and that said Letters Patent is hereby corrected as shown below:

<u>Column 10,</u>
Line 29, should read as follows:
17. A method for making a semiconductor device, comprising the steps of:
 providing a semiconductor substrate;
  etching a plurality of openings in the semiconductor substrate such that, upon completion of the etch,
  at least some of the opening have an organometallic processing residue disposed on a surface
   thereof, the processing residue having been formed during the etching process; and
  removing at least a portion of the processing residue by contacting the processing residue with a
   micellar solution;
  wherein the micellar solution comprises, by weight, about 0.01% to about 1% hydrocarbon surfactant, about 1% to about 10% citric acid, and about 1% to about 10% oxalic acid.
Line 41, should read as follows:
18. The method of claim 17, wherein the micellar solution further comprises, by weight, about 0.01% to about 1% hydrocarbon surfactant, about 1% to about 10% citric acid, about 1% to about 10% oxalic acid, and about 1% to about 10% ethylene glycol monobutyl ether (EGMBE).

Signed and Sealed this

Thirtieth Day of May, 2006

JON W. DUDAS
*Director of the United States Patent and Trademark Office*